(12) United States Patent
Yamada et al.

(10) Patent No.: US 7,057,243 B2
(45) Date of Patent: Jun. 6, 2006

(54) HYBRID SEMICONDUCTOR DEVICE HAVING AN N+ (P) DOPED N-TYPE GATE AND METHOD OF PRODUCING THE SAME

(75) Inventors: Satoru Yamada, Tokyo (JP); Ryo Nagai, Tokyo (JP); Kiyonori Oyu, Tokyo (JP); Ryoichi Nakamura, Tokyo (JP); Norikatsu Takaura, Tokyo (JP)

(73) Assignees: Elpida Memory, Inc., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/648,883

(22) Filed: Aug. 27, 2003

(65) Prior Publication Data

US 2004/0150020 A1 Aug. 5, 2004

(30) Foreign Application Priority Data

Aug. 27, 2002 (JP) .............................. 2002-246287

(51) Int. Cl.
*H01L 29/94* (2006.01)
(52) U.S. Cl. ...................... 257/407; 257/213; 257/288; 257/402
(58) Field of Classification Search ................ 257/407, 257/412
See application file for complete search history.

(56) References Cited

U.S. PATENT DOCUMENTS

| | | | |
|---|---|---|---|
| 5,932,919 A * | 8/1999 | Schwalke |
| 5,953,246 A * | 9/1999 | Takashima et al. |
| 6,216,246 B1 * | 4/2001 | Shau |
| 6,573,169 B1 * | 6/2003 | Noble et al. |
| 6,573,575 B1 * | 6/2003 | Yamazaki |

\* cited by examiner

*Primary Examiner*—Nathan J. Flynn
*Assistant Examiner*—Kevin Quinto
(74) *Attorney, Agent, or Firm*—Scully, Scott, Murphy & Presser, P.C.

(57) ABSTRACT

In a semiconductor device of a polysilicon gate electrode structure having three or more different Fermi levels, a P type polysilicon having a lowest Fermi level is disposed on a first N type surface channel MOS transistor. A first N type polysilicon having a highest Fermi level is disposed on a second N type surface channel MOS transistor. A second N type polysilicon having an intermediate Fermi level between the highest and the lowest Fermi levels and doped with both an N type impurity and a P type impurity is disposed on a P channel MOS transistor.

20 Claims, 9 Drawing Sheets

HYBRID SEMICONDUCTOR DEVICE HAVING AN N+ (P) DOPED N-TYPE GATE AND METHOD OF PRODUCING THE SAME

The present invention claims priority to prior Japanese application JP 2002-246287, the disclosure of which is incorporated herein by reference.

BACKGROUND OF THE INVENTION

The present invention relates to a semiconductor device (MOS integrated circuit) of a polysilicon gate structure having three or more different Fermi levels and, in particular, to a semiconductor device (MOS integrated circuit) with a DRAM having a polymetal gate.

Figure 1:
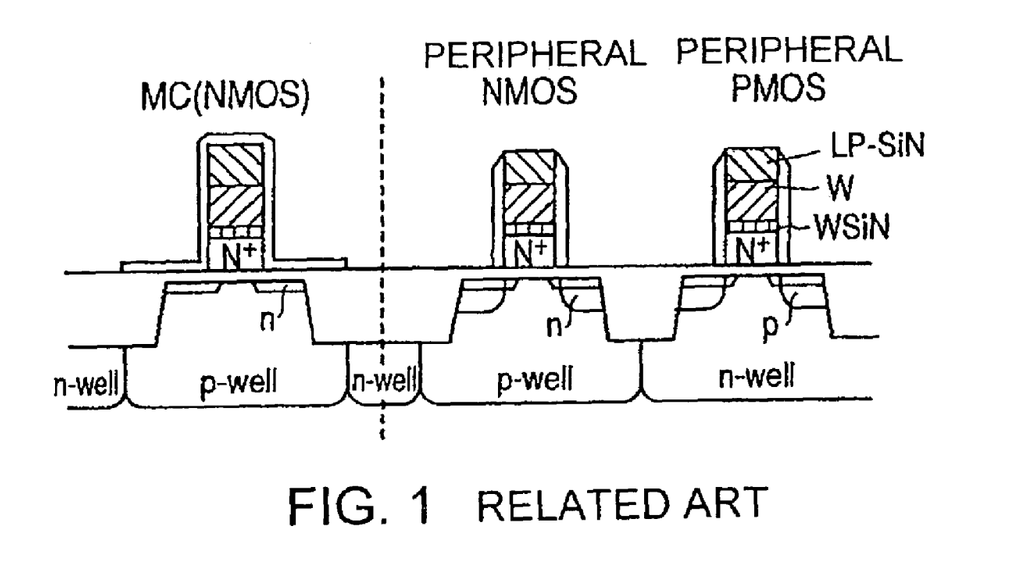
FIG. 1 is a view showing the structure of a semiconductor device (MOS integrated circuit) according to a first related technique.

FIG. 1 shows a semiconductor device (MOS integrated circuit) according to a first related technique. According to the first related technique, all of an NMOS as a memory cell (MC), a peripheral NMOS, and a peripheral PMOS have $N^+$ gates. Therefore, no mask is required to separately form different types of gates. However, the peripheral PMOS having the $N^+$ gate PMOS has a buried channel. This results in inferior short-channel characteristic and low drive power.

Figure 2:
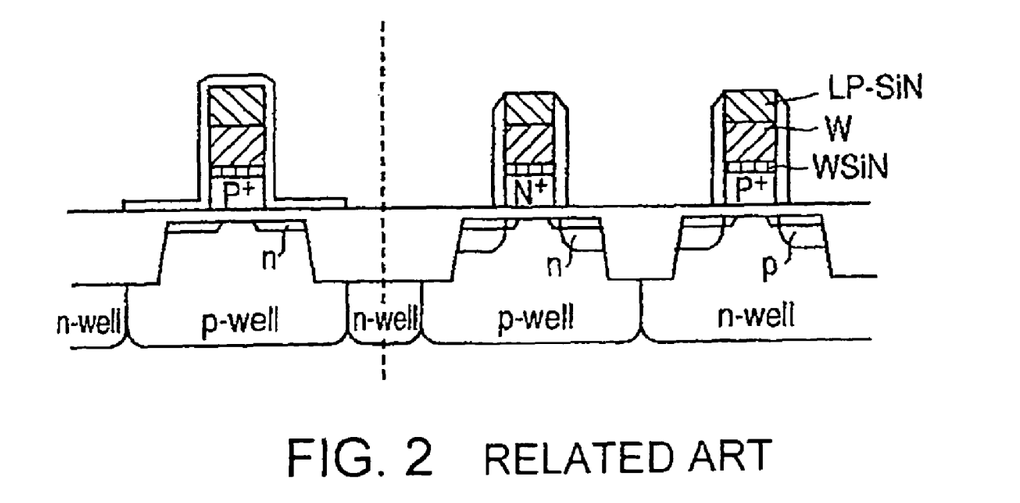
FIG. 2 is a view showing the structure of a semiconductor device (MOS integrated circuit) according to a second related technique.

FIG. 2 shows a semiconductor device (MOS integrated circuit) according to a second related technique. According to the second related technique, the peripheral PMOS has a $P^+$ gate. With this structure, it is possible to obtain large drive power by improving the short-channel characteristic of the PMOS as a largest problem of the first related technique. In addition, it is possible to reduce a junction field of the memory cell. However, the second related technique is disadvantageous in the following respects.

The concentration of a P type impurity in the $P^+$ gate must be determined primarily so as to reduce the depletion of the peripheral PMOS. This means that the concentration of the P type impurity of the $P^+$ gate must be selected to a relatively high value. As a result, a margin for boron leakage is reduced in both of the memory cell and the peripheral PMOS. Furthermore, in order to obtain high power, two masks are required to form two kinds of gates.

Hereinafter, the disadvantages of the related technique will be described in detail.

First Disadvantage of the Related Technique

It is impossible to simultaneously suppress gate depletion and threshold (Vth) fluctuation due to boron penetration.

Figure 3:
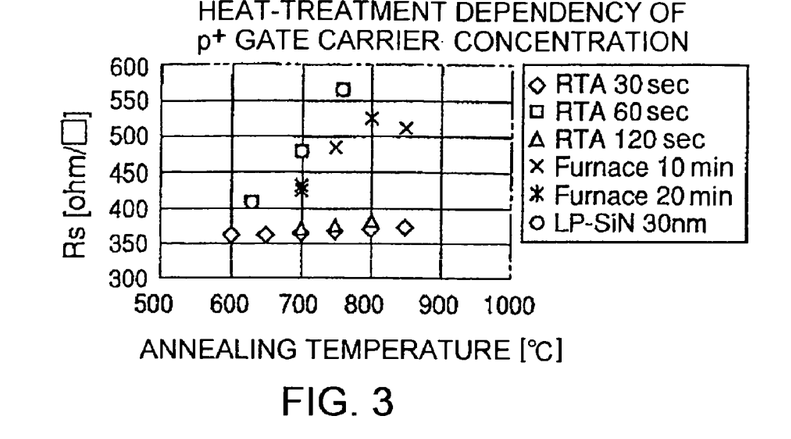
FIG. 3 shows the heat-treatment dependency of the $P^+$ gate carrier concentration.

FIG. 3 shows heat-treatment dependency of the activation rate of boron injected into the $p^+$ gate. In furnace annealing and furnace CVD in which thermal load is applied for a long time, deactivation of boron in gate polysilicon is remarkable at a temperature not lower than 600 degrees C. Such deactivation results in gate depletion.

Figure 4:
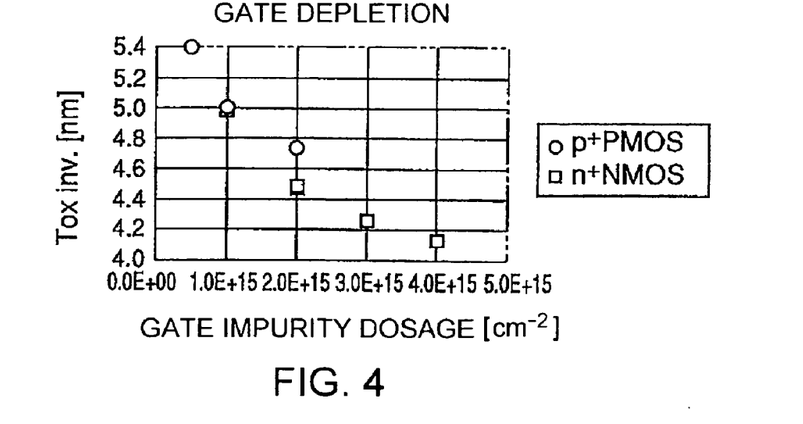
FIG. 4 shows the relationship between an electrical oxide thickness in inversion and the impurity concentration of a gate.

FIG. 4 shows the relationship between the electrical oxide thickness in inversion and the gate impurity concentration. As the gate impurity concentration is higher, the gate depletion is more suppressed.

Figure 5:
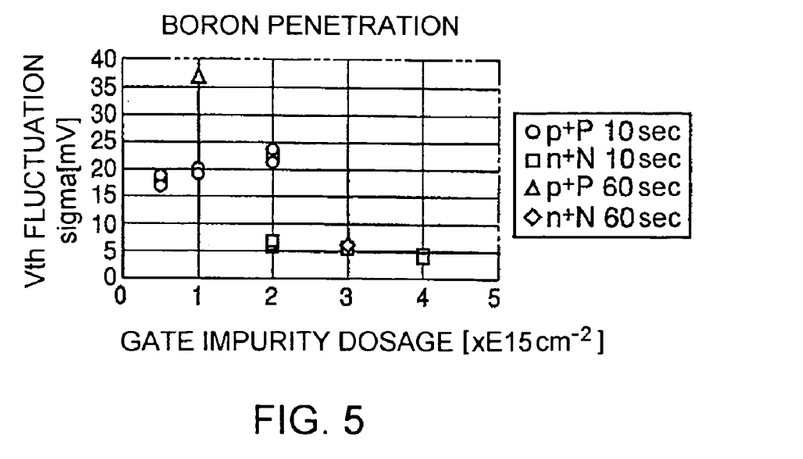
FIG. 5 shows the relationship between the Vth fluctuation and the impurity concentration of a gate.

FIG. 5 shows the relationship between the threshold (Vth) fluctuation and the gate impurity concentration. In an $n^+$ gate containing phosphorus injected therein, the Vth fluctuation is smaller as the phosphorus concentration is higher. This is because the degree of carrier degeneration is enhanced as the concentration of phosphorus in the gate is higher, so that the Fermi level of the gate is stable.

On the other hand, in the $p^+$ gate containing boron injected therein, the Vth fluctuation is increased as the boron concentration is higher. This is because the influence of penetration of boron in the gate into the substrate is greater than the effect of the enhancement of carrier degeneration.

Second Disadvantage of the Related Technique

The gate electrode of a dual polymetal structure has a large contact resistance with respect to W/$p^+$(n) polysilicon.

Figure 6:
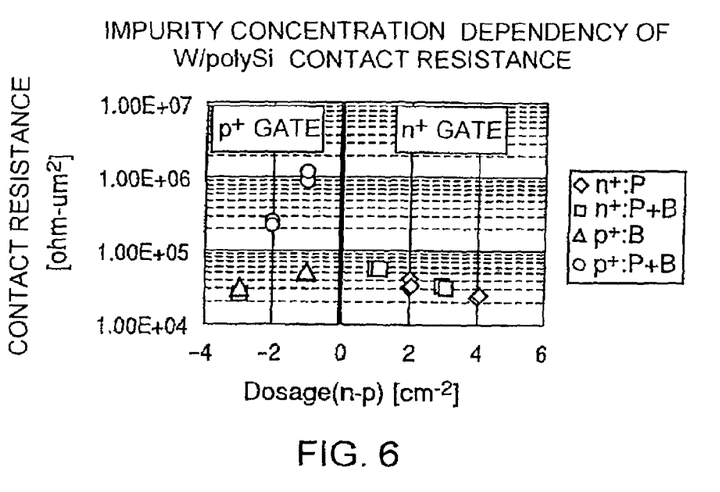
FIG. 6 shows the relationship between the impurity dosage into a gate silicon and the contact resistance.

FIG. 6 shows the relationship between the impurity dosage injected into the polysilicon gate and the contact resistance. As regards the $n^+$ gate, the difference in contact resistance is small between the specification of injection of phosphorus alone and the specification of injection of both phosphorus and boron. On the other hand, as regards the $p^+$ gate, the difference in contact resistance is extremely large between the specification of injection of boron alone and the specification of injection of both boron and phosphorus. The contact resistance in the specification of injection of both phosphorus and boron is as large as at least ten times that in the specification of injection of boron alone.

Third Disadvantage of the Related Technique

An n-well is subjected to a large influence of boron penetration.

Figure 7:
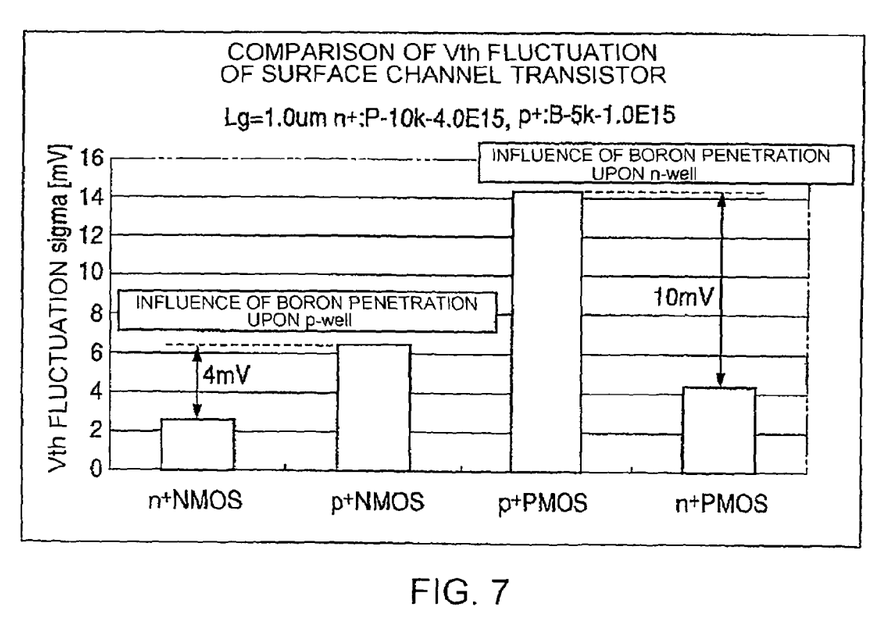
FIG. 7 shows the Vth fluctuation depending upon a combination of a conductive type of a gate and a conductive type of a substrate.

FIG. 7 shows the Vth fluctuation dependent upon a combination of a conductive type of a gate and a conductive type of a substrate. In the NMOS, the difference in Vth fluctuation between the $p^+$ gate and the $n^+$ gate is 4 mV. On the other hand, in the PMOS, the difference in Vth fluctuation between the $p^+$ gate and the $n^+$ gate is 10 mV. Thus, the influence of boron penetration upon the transistor characteristic is greater with respect to the n-well than to the p-well.

Figure 8:
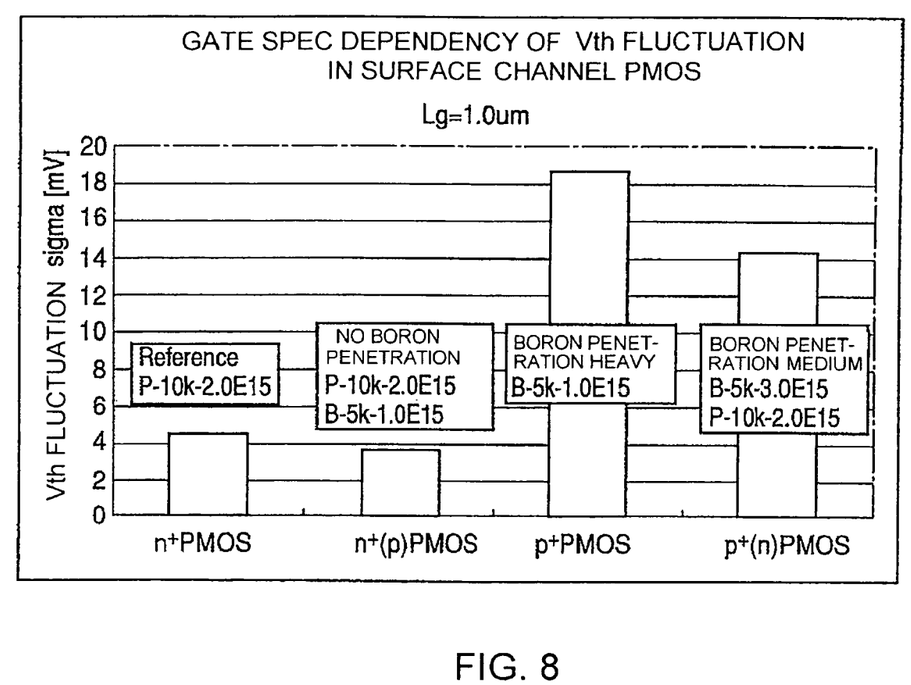
FIG. 8 shows the Vth fluctuation of the PMOS, depending upon a combination of impurities in a gate polysilicon.

FIG. 8 shows the Vth fluctuation of the PMOS, dependent upon a combination of impurities in the gate polysilicon. In case of the $n^+$(p) gate, the Vth fluctuation is substantially equivalent to that of the $n^+$ gate and, therefore, the influence of boron penetration is negligible.

SUMMARY OF THE INVENTION (1) Depletion of the $P^+$ Gate PMOS

If a supply voltage is decreased, power consumption can be reduced. However, if the supply voltage is decreased, the drive power of the MOS transistor is decreased. In order to compensate the decrease in performance of the MOS transistor, it is a past approach to lower the process temperature so that the controllability of an impurity profile of the substrate is improved.

However, if the supply voltage is 1.8V or less, the drive power of the PMOS is insufficient. The reason is as follows. If the $N^+$ gate is used, the PMOS has a buried channel. With this structure, it is necessary to assure the punch through resistance. In this event, the gate length can not be shortened.

Furthermore, in order to lower the threshold voltage and to improve the drive power, the boron concentration must be increased. It is known that, if the impurity concentration in a depletion layer becomes higher, the threshold fluctuation is increased. In view of the above, it is proposed to use the $P^+$ gate PMOS free from the above-mentioned problems. However, the use of the $P^+$ gate PMOS is disadvantageous in the following respects.

In a DRAM with a 0.2 μm design rule or smaller, each of the word line pitch and the bit line pitch is 0.4 μm or less. Therefore, memory cell contact holes must be formed in a self alignment manner with respect to the gate electrodes. In order to form the memory cell contact holes without causing short-circuiting with the gate electrodes and the bit lines, a film having an etch rate smaller than that of an interlayer insulating film during etching of the memory cell contact holes must be present on each of upper and side surfaces of the gate electrodes and the bit lines.

In experimental production by the present inventors, a silicon oxide film was used as the interlayer insulating film and a silicon nitride film was used as the film formed on each of the upper and the side surfaces of the gate electrodes and the bit lines. In case where the space between adjacent gate electrodes is about 0.2 μm or less, the silicon nitride film formed on the side surface of each of the gate electrodes and the bit lines is required to have a good coverage. In order to attain a good coverage, low-pressure CVD must be used. Formation of the silicon nitride film by the low-pressure CVD requires 3 to 5 hours at a temperature between 600 degrees C. and 800 degrees C.

According to the experimental test by the present inventors, it has been found out that, if heat treatment is performed at a temperature between 600 degrees C. and 800 degrees C. for a long time, deactivation of N type and P type impurities which have been activated in polysilicon is remarkable. If a polysilicon gate electrode is used, the impurities introduced into polysilicon is deactivated. Deactivation of the gate electrode results in an increase in thickness of a carrier depletion region adjacent the gate electrode in the vicinity of the gate oxide film when the gate is applied with an inverted potential. The gate depletion is effectively equivalent to an increase in thickness of the gate oxide film. Therefore, the drive power of the MOS transistor is decreased and the short channel characteristic is degraded.

The depletion of the gate polysilicon can be improved if the gate impurity concentration is increased. In the $N^+$ gate using phosphorus as the N type impurity, the solid solubility of phosphorus is about $1$ $E21$ $cm^{-3}$ in RTA (Rapid Thermal Annealing) at about 1000 degrees C. generally used. Even if 50% of phosphorus is deactivated by the above-mentioned long-time heat treatment at a temperature between 600 degrees C. and 800 degrees C., the carrier concentration of $5E20$ $cm^{-3}$ is yet assured. Furthermore, the probability of diffusion of phosphorus penetrating the gate oxide film is low and, therefore, the threshold fluctuation of the MOS transistor is negligible.

On the other hand, if boron is used as the P type impurity in the $P^+$ gate, the solid solubility of boron is about $1E20$ $cm^{-3}$ under the above-mentioned condition. Since the diffusion coefficient of boron in the gate oxide film is great, boron reaches the substrate even by the heat treatment at a relatively low temperature (namely, boron penetration occurs). Therefore, the threshold voltage of the MOS transistor is fluctuated and the fluctuation is increased.

During the long-time heat treatment at a temperature between 600 degrees C. and 800 degrees C. in which a silicon nitride film is formed by the low-pressure CVD, not only deactivation but also boron penetration occur simultaneously. The boron penetration and the depletion have a trade-off relationship. If the boron concentration is decreased in order to suppress boron penetration, the depletion becomes remarkable.

As will be understood from the foregoing, it is difficult to prevent the depletion of the $P^+$ gate PMOS in a dual-gate transistor for the DRAM.

In view of the above, it has been proposed to form an $N^+$ gate ($N^+(P)$ gate) having a relatively low Fermi level by doping boron into the $N^+$ gate. In the $N^+(P)$ gate PMOS, the problem of gate depletion does not occur. In addition, the depth of the buried channel is reduced. Therefore, it is possible to improve the short channel characteristic which is an initial problem.

In particular, if the Fermi level of the $N^+(P)$ gate is lower than that of the substrate, a surface channel can be obtained.

Furthermore, the present inventors have experimentally confirmed that, in case of coexistence of phosphorus and boron, the diffusion coefficient of boron is reduced as compared with the case of existence of boron alone. This is presumably because a phosphorus-boron pair is formed.

The present inventors have also confirmed that, as a result of the reduction in diffusion coefficient of boron, the probability of penetration of boron through the oxide film is decreased and the threshold fluctuation can be decreased as compared with the case of existence of boron alone. In addition, as the impurity concentration in the depletion layer of the substrate is low, the threshold fluctuation can be reduced as compared with the $N^+$ gate PMOS.

(2) Extension of Refresh Cycle of Memory Cell

In a memory cell of the DRAM, information (data) must be rewritten before electric charges stored in a capacitor are lost. The electric power required for such rewriting is a predominant factor in a self-refresh mode of an ultra low power consumption DRAM which is expected to be widely used in mobile apparatuses in future. If the refresh cycle can be extended, it is possible to effectively reduce the power consumption.

The electric charges stored in the capacitor are classified into a component flowing through an insulating film of the capacitor to an opposite electrode as a tunnel current and another component flowing into the substrate by band-to-band tunneling under a junction field with the substrate. In the DRAM having a typical structure in which a half of a writing potential is applied to the opposite electrode, a leak current component at 100 degrees C. includes about 1E-15A/bit as the component flowing into the opposite electrode and about 1E-14A/bit as the component flowing into the substrate. Thus, the latter is predominant.

The component flowing into the substrate can be reduced by decreasing the junction field between an N-type diffusion layer kept at the potential of a capacitor lower electrode and a P-type diffusion layer inversely biased to a negative potential. If the impurity concentration is lowered, the junction field can be reduced. However, if the impurity concentration of the N-type diffusion layer is reduced, parasitic resistance is increased. If the impurity concentration of the substrate is reduced, off current is increased.

In order to assure a high threshold voltage even if the impurity concentration of the substrate is lowered, it is proposed to use a $P^+$ gate NMOS in which the difference in Fermi level between the gate electrode and the P-type substrate is small. Since the gate electrode of the $P^+$ gate NMOS is not depleted, the concentration of boron introduced into the gate can be selected to be relatively small, taking the boron penetration into consideration.

In case of the $P^+$ gate NMOS, the width of the depletion layer of the P-well below the gate electrode is narrow as compared with the $N^+$ gate NMOS. Therefore, GIDL (Gate Induced Drain Leakage) is unfavorably increased as compared with the $N^+$ gate NMOS. However, such increase in GIDL is within a range allowing optimization in association with the reduction in junction field by adjusting the Fermi level of the gate.

(3) Reduction of Word Line Resistance

In the DRAM, it is desired that word lines are as long as possible for the purpose of reducing the area of a peripheral circuit such as a word line drive circuit in order to reduce the chip area. The word line length is mainly limited by an RC time constant. Thus, the word line resistance and the word line parasitic capacitance are preferably as small as possible.

Therefore, the word line often has a polycide structure.

Consideration will be made of a dual gate having a polycide structure. In this case, boron in the P type polysilicon is diffused in silicide so that the boron concentration in the P type polysilicon tends to be decreased. In addition, the concentration of the N type impurity in the N type polysilicon connected to the P type polysilicon is varied.

In order to suppress the impurity diffusion and to achieve low resistance, a polymetal structure is proposed. In the polymetal structure, a barrier layer such as tungsten nitride must be formed between an upper metal and the polysilicon in order to suppress silicide reaction therebetween. It is known that, after activation annealing of a source and a drain at around 900 degrees C., an amorphous layer of tungsten, silicon, and nitrogen is formed in case where the barrier layer is tungsten nitride. The present inventors have confirmed that the contact resistance between tungsten and polysilicon through the amorphous layer depends upon the carrier concentration of polysilicon.

The present inventors have confirmed that, as illustrated in FIG. 6, the carrier concentration dependency of the contact resistance between the $N^+$ polysilicon and tungsten exhibits the same tendency in case of existence of the N type impurity alone and in case of coexistence of the N type and the P type impurities. In order to lower the contact resistance between tungsten and polysilicon, it is effective that an N type impurity, such as phosphorus, is ion implanted upon formation of an $N^+(P)$ polysilicon to thereby increase the surface carrier concentration of the $N^+(P)$ polysilicon above the average concentration in the bulk.

On the other hand, in case of the $P^+$ polysilicon, coexistence of the N type and the P type impurities results in remarkable carrier concentration dependency of the contact resistance between tungsten and polysilicon as compared with the case of existence of the P type impurity alone, as experimentally confirmed by the present inventors. Therefore, in case of the polymetal structure, the $P^+$ polysilicon preferably contains the P type impurity alone or contains a sufficiently low concentration of the N type impurity in addition to the P type impurity.

It is therefore an object of the present invention to provide a DRAM specific transistor capable of improving the performance of a PMOS as a peripheral circuit of the DRAM, suppressing a word line resistance, and reducing a junction field of a memory cell.

According to the present invention, there is provided a semiconductor device of a polysilicon gate electrode structure having three or more different Fermi levels, wherein a P type polysilicon having a lowest Fermi level is disposed on a first N type surface channel MOS transistor, an N type polysilicon having a highest Fermi level being disposed on a second N type surface channel MOS transistor, an N type polysilicon having a Fermi level between the highest and the lowest Fermi levels and doped with both an N type impurity and a P type impurity being disposed on a P channel MOS transistor.

With the above-mentioned structure, the P channel MOS transistor and the second N type surface channel MOS transistor are disposed in a peripheral circuit while the first N type surface channel MOS transistor is disposed in a memory cell.

In this case, the $N^+$ gate polysilicon containing both the P type impurity and the N type impurity has impurity concentration distribution in which the concentration of at least the N type impurity at an upper surface of the polysilicon is higher than the average concentration in the polysilicon.

Upon formation of the $N^+$ gate containing both the P type impurity and the N type impurity, at least the N type impurity is doped by ion implantation.

In the present invention, the semiconductor device is produced by separately forming regions of three kinds of desired gate impurity concentrations by using two masks.

In this case, the N type polysilicon doped with both the N type impurity and the P type impurity is formed by simultaneously activating phosphorus and boron. By simultaneously activating phosphorus and boron, diffusion of boron towards the substrate is suppressed.

According to the present invention, there is also provided a semiconductor device comprising a DRAM having a gate electrode of a polymetal structure, wherein an $N^+$ gate PMOS containing both a P type impurity and an N type impurity and an N gate NMOS are disposed in a peripheral circuit while a $P^+$ gate NMOS containing a P type impurity alone is disposed in a memory cell.

DESCRIPTION OF THE PREFERRED EMBODIMENT

Figure 9:
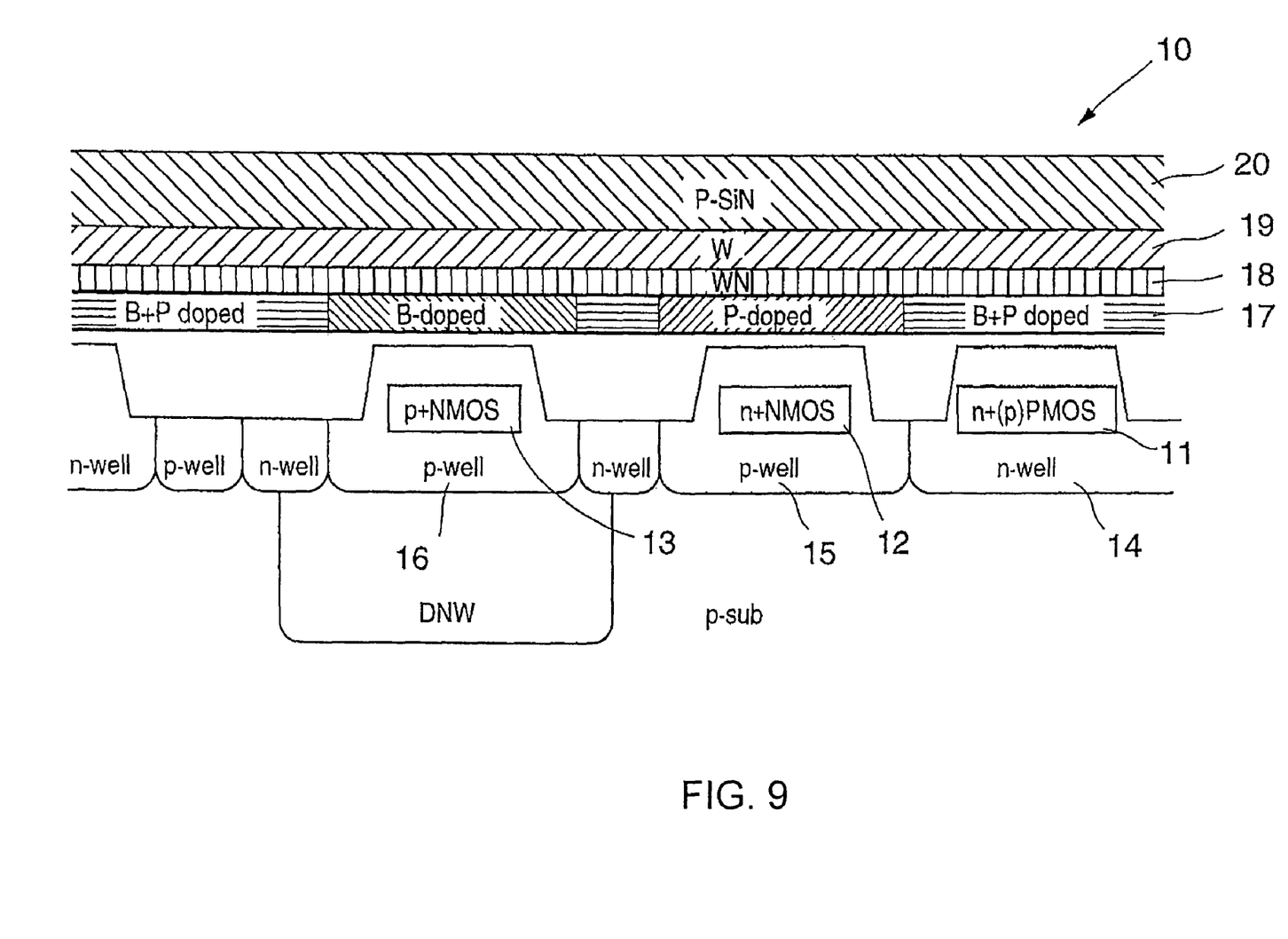
FIG. 9 is a view showing the structure of a semiconductor device according to an embodiment of the present invention.

Referring to FIG. 9, description will be made of a semiconductor device (DRAM) according to an embodiment of the present invention.

In FIG. 9, a combination of a conductive type of an impurity in a gate electrode and a conductive type of an impurity in a substrate is shown. Impurities are introduced into a gate polysilicon by ion implantation using two masks.

In a DRAM having a gate electrode of a polymetal structure or an LSI 10 with the DRAM, an $N^+(P)$ gate PMOS 11 and an N+ gate NMOS 12 are disposed in a peripheral circuit. A P+ gate NMOS 13 is disposed in a memory cell.

In detail, the N+(P) gate PMOS 11 is formed in an n-well 14. The N+ gate NMOS 12 is formed in a p-well 15. The P+ gate NMOS 13 is formed in a p-well 16.

On the N+(P) gate PMOS 11, the N+ gate NMOS 12, and the P+ gate NMOS 13, a polysilicon layer 17 is formed. On the polysilicon layer 17, a tungsten nitride (WN) layer 18 is formed as a barrier metal. On the tungsten nitride (WN) layer 18, a tungsten (W) layer 19 is formed. On the tungsten (W) layer 19, a P-SiN layer 20 is formed. Herein, the material of the barrier metal is not limited to WN but may be a different material such as molybdenum nitride (MoN). The laminate structure is not limited to W/WN/polysilicon but may be Mo/MoN/polysilicon, W/WN/WSi/polysilicon, Mo/MoN/MoSi/polysilicon, or the like.

Referring to FIGS. 10A through 10E, description will be made of a production process for producing the DRAM illustrated in FIG. 9.

Figure 10A:
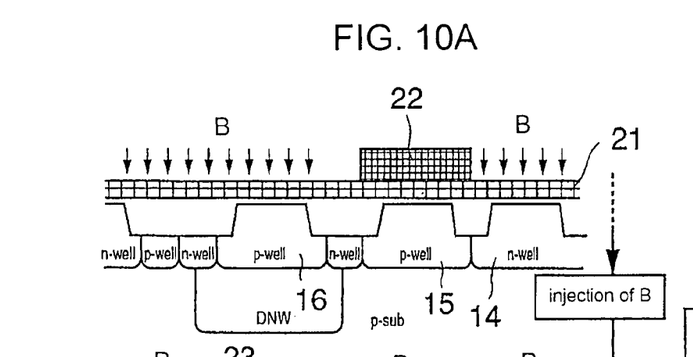
FIGS. 10A through 10E are views for describing a production process of the semiconductor device illustrated in FIG. 9.

As illustrated in FIG. 10A, an amorphous silicon layer 21 is deposited on a gate insulating film by low-pressure CVD. Herein, the thickness of the amorphous silicon layer 21 is, for example, 100 nm. No impurity is doped.

Next, the amorphous silicon layer 21 is covered with a resist 22 in an area over the p-well 15 except a memory cell. Boron is ion implanted into the amorphous silicon layer 21 in an area over the p-well 16 of the memory cell and in an area over the n-well 14 of the peripheral circuit. For example, ion implantation of boron is carried out at the energy of 5 keV and the dosage of 1E15 $cm^{-2}$.

Figure 10B:
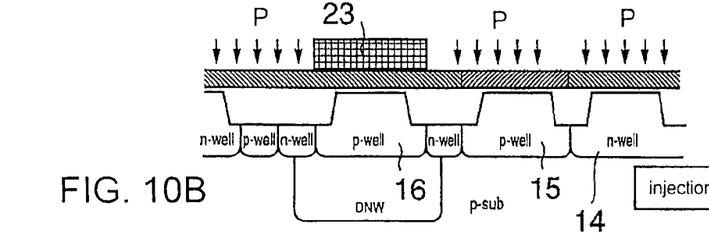

As illustrated in FIG. 10B, the amorphous silicon layer 21 is covered with a resist 23 in the area over the p-well 16 of the memory cell. Phosphorus is ion implanted into the amorphous silicon layer 21 in the areas over the p-well 15 and the n-well 14 of the peripheral circuit except the memory cell. For example, ion implantation of phosphorus is carried out at the energy of 10 keV and the dosage of 5E15 $cm^{-2}$.

After removing the resists 22 and 23, the surface of the amorphous silicon layer 21 is cleaned by the use of a mixed solution of $NH_4OH$ and $H_2O_2$ and chemical oxide is formed simultaneously. In order to activate boron and phosphorus ion implanted into the amorphous silicon layer 21, annealing is carried out. For example, the annealing is carried out at 950 degrees C. for 10 seconds in an $N_2$ atmosphere. As a result, the polysilicon layer 17 is formed.

Preferably, a very small amount of $O_2$ is mixed into $N_2$. For example, the ratio of $O_2$ is 1%. During annealing, the chemical oxide serves to suppress external diffusion of boron and phosphorus. The very small amount of $O_2$ prevents nitridation of the upper surface of the polysilicon layer 17. By the use of HF diluted with $H_2O$, a silicon oxide film formed on the upper surface of the polysilicon layer 17 is removed.

Figure 10C:
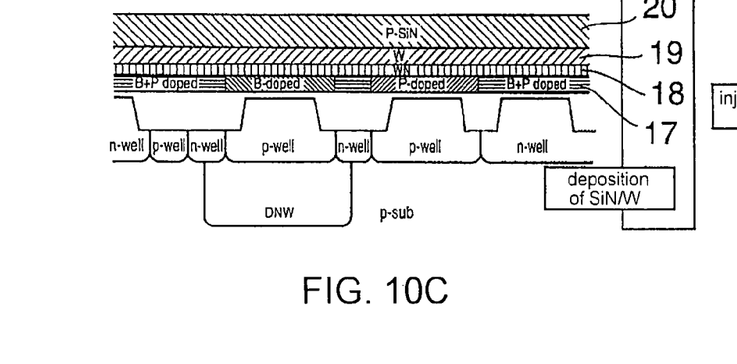

As illustrated in FIG. 10C, the tungsten nitride (WN) layer 18 and the tungsten (W) layer 19 are deposited on the polysilicon layer 17 by sputtering. For example, the thickness of the WN layer 18 is 5 nm and the thickness of the W layer 19 is 60 nm. On the W layer 19, the SiN layer 20 is deposited by plasma CVD. For example, the thickness of the SiN layer 20 is 120 nm.

Figure 10D:
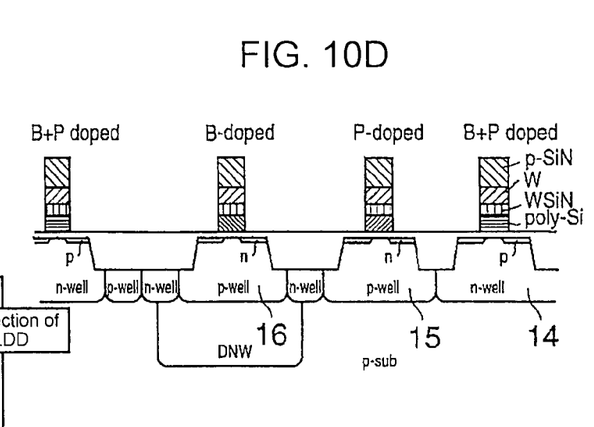

Next, as illustrated in FIG. 10D, gate electrodes are patterned by the use of a resist mask (not shown). After removing the resist, phosphorus or arsenic is ion implanted into an NMOS 16. For example, ion implantation of phosphorus is carried out at the energy of 10 keV and the dosage of 1E13 $cm^{-2}$. For example, ion implantation of arsenic is carried out at the energy of 10 keV and the dosage of 1E14 $cm^{-2}$.

On the other hand, $BF_2$ is ion implanted into a PMOS 14. For example, ion implantation of $BF_2$ is carried out at the energy of 10 keV and the dosage of 1E14 $cm^{-1}$. In order to activate phosphorus, arsenic, and $BF_2$ ion implanted, annealing is carried out. For example, the annealing is carried out at 950 degrees C. for 10 seconds in an $N_2$ atmosphere. It is not preferable to mix $O_2$ into $N_2$ in view of preventing W exposed on the side surface of the gate electrode from being oxidized.

Figure 10E:
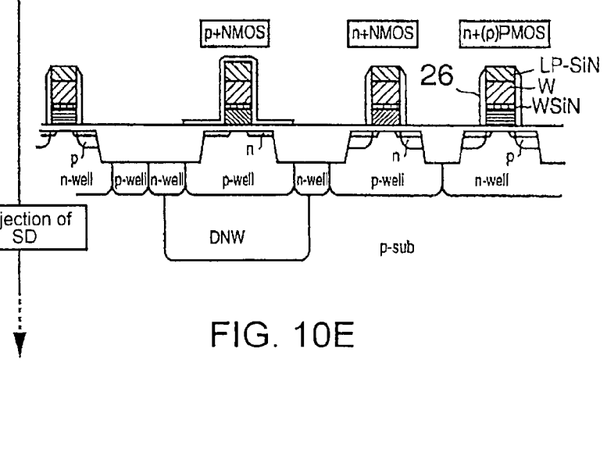

As illustrated in FIG. 10E, a spacer 26 is formed on each of the side surfaces of the gate prior to formation of a source and a drain heavily doped. A film forming the spacer 26 is required to have a good coverage. For example, the spacer 26 comprises an SiN film formed by low-pressure CVD and has a thickness of 30 nm. The steps after formation of the source and the drain are similar to those of a DRAM process well known in the art.

According to the embodiment of the present invention, it is possible to improve the performance of the peripheral PMOS and to extend the refresh cycle in a DRAM of a generation of a supply voltage of 1.8 V or less or an LSI comprising the DRAM. As a result, it is possible to reduce power consumption of the DRAM.

Herein, the supply voltage can be lowered by the following reason (1). The refresh cycle can be extended by the following reason (2). By these two effects, the power consumption of the DRAM can be reduced.

(1) The Fermi level of the gate polysilicon of the n+ gate PMOS can be set low so that the dosage of the p type impurity to be injected into the channel can be reduced. As a result, the depth of the buried channel is decreased so that the short circuit characteristic is improved. If an off current (Ioff) is selected to be equal to that of a transistor of a known structure, the gate length L can be reduced so that an on current (Ion) can be increased.

Figure 11A:
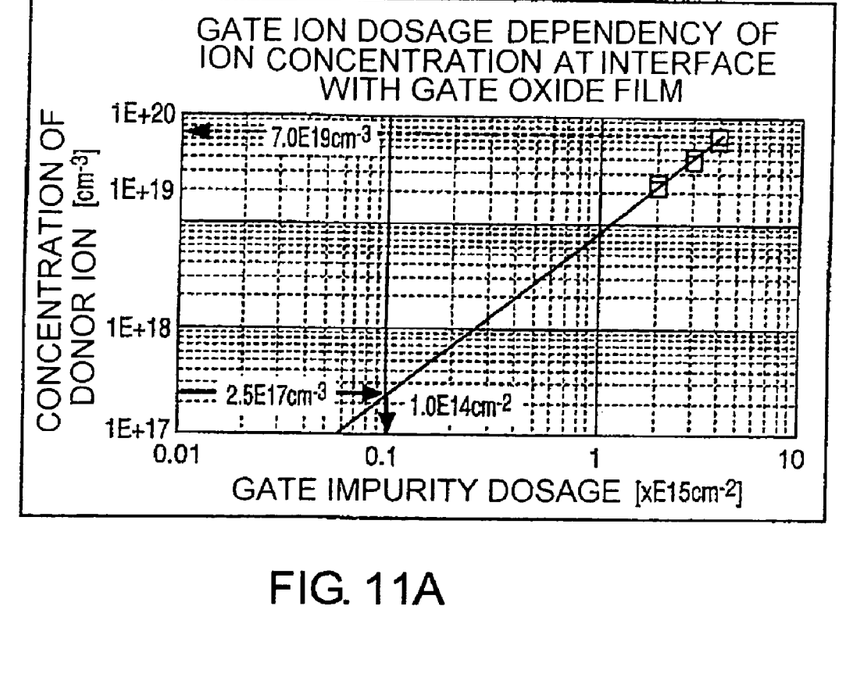
FIGS. 11A and 11B shows the effect of reducing the dosage of boron into a channel in a PMOS having an $N^+(P)$ polysilicon gate.
Figure 11B:
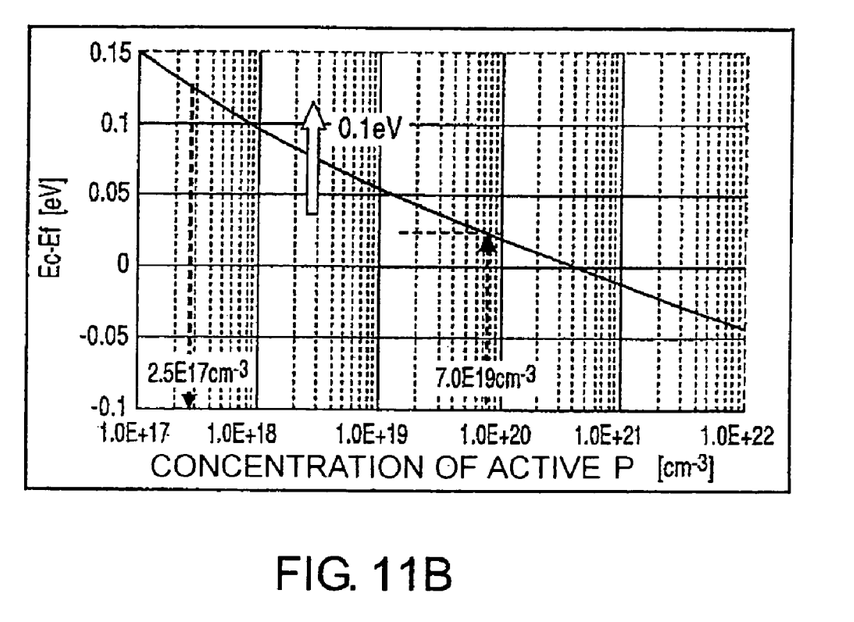

FIGS. 11A and 11B shows the effect of reducing the dosage of boron into the channel in the PMOS having the N+(P) polysilicon gate.

In the transistor of the present invention, the dosage of boron to be injected into the n-well can be decreased by about 10% if the Fermi level of the gate polysilicon of the PMOS in the vicinity of the gate oxide film is lowered by 0.1 eV. In the example being illustrated in FIGS. 11A and 11B, the Fermi level of the N+ gate in the vicinity of the gate oxide film is lowered by 0.1 eV if the difference between the donor concentration and the accepter concentration in the polysilicon in the vicinity of the gate oxide film is reduced from 7.0E19 $cm^{-3}$ to 2.5E17 $cm^{-3}$. In terms of dosage of phosphorus to be ion implanted, this corresponds to the reduction from 4.0E15 $cm^{-2}$ to 1.0E14 $cm^{-2}$. The effect of reducing the concentration of boron injected into the n-well contributes to reduction in depth of the P-type buried channel. The reduction in depth of the buried channel contributes to the reduction of an s coefficient.

Figure 12:
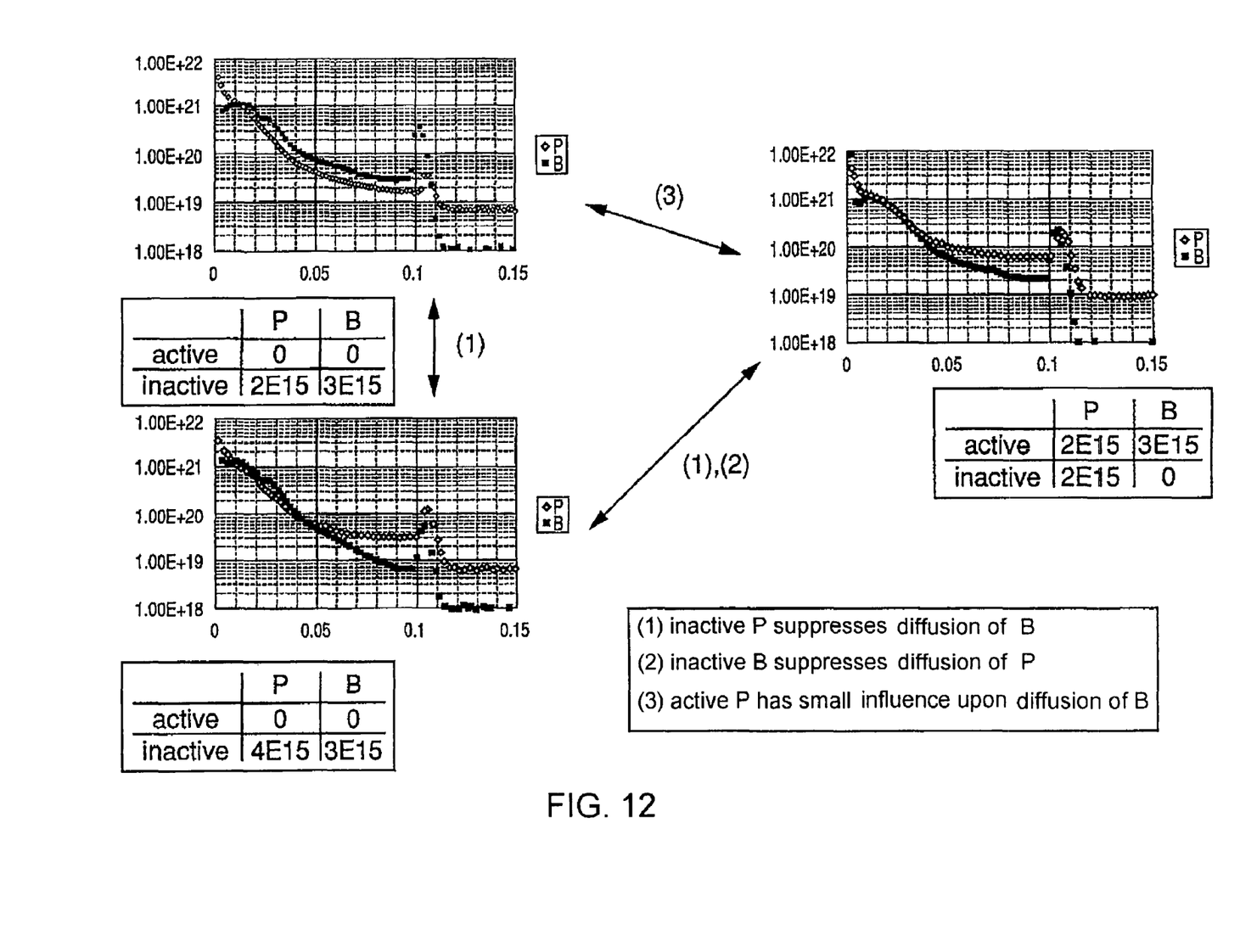
FIG. 12 shows the data related to the probability of penetration of boron through a gate oxide film.

Referring to FIG. 12, amorphous silicon with both of phosphorus and boron ion implanted is annealed to simultaneously carry out diffusion and activation of phosphorus and boron. In this event, phosphorus suppresses diffusion of boron so that the probability of penetration of boron through the gate oxide film is reduced.

The above-mentioned phenomenon is confirmed by transistor characteristics as shown in FIG. 8.

The threshold (Vth) fluctuation of the PMOS having the N+(P) polysilicon gate is substantially equivalent to the Vth fluctuation of the PMOS having the n⁺ polysilicon gate. Therefore, the influence of boron penetration is negligible.

(2) If the p⁺ gate NMOS is used in the memory cell, it is possible to reduce the concentration of the p type impurity to be injected into the channel in order to increase Vth. As a result, it is possible to decrease the junction field between the substrate and a low-concentration n type diffusion layer of the source/drain (SD). Therefore, it is possible to reduce pn junction leak current which is a predominant factor of leak current of the memory cell. This means that the refresh cycle can be extended.

In the transistor according to the present invention, the use of the p⁺ gate NMOS contributes to reduction of dosage of boron by about 1E13 cm⁻² as compared with the n⁺ gate NMOS. As a result, it is possible to remarkably reduce the junction field between the n-layer of the memory cell and the p-well and to reduce the pn junction leak current.

As illustrated in FIG. 7, the influence of boron penetration upon the p-well is small as compared with the influence of boron penetration upon the n-well.

Referring to FIGS. 13A through 13E, description will be made of another production process for producing the DRAM illustrated in FIG. 9.

Figures 13A, 13B:
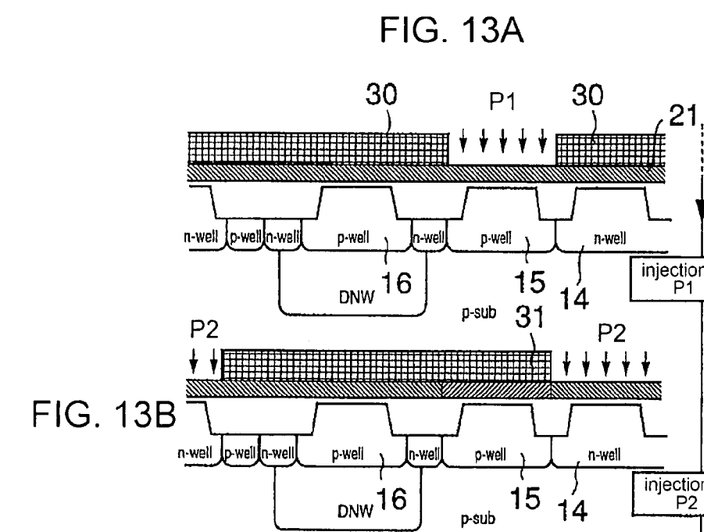
FIGS. 13A through 13E are views for describing another production process of the semiconductor device illustrated in FIG. 9.
Figure 13C:
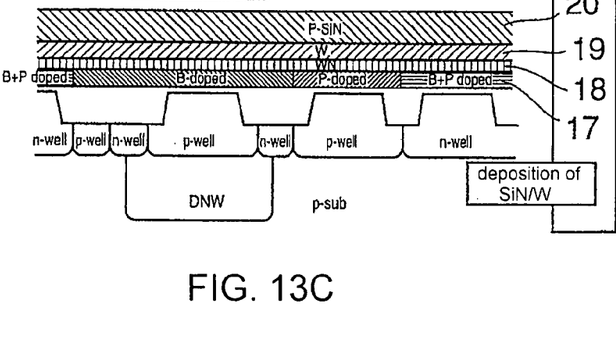
Figure 13D:
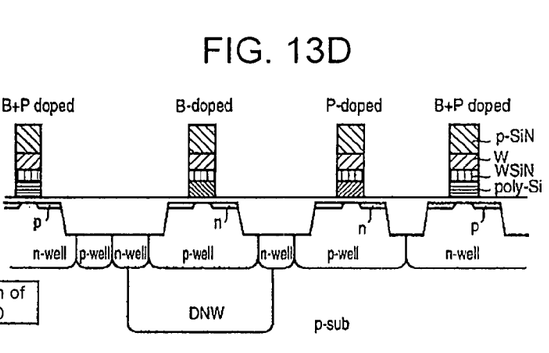
Figure 13E:
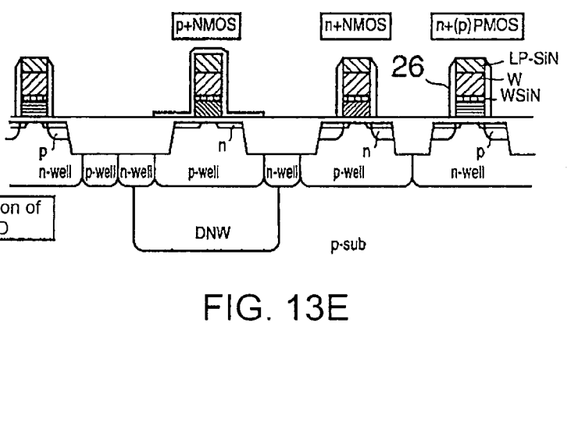

At first referring to FIG. 13A, the amorphous silicon layer 21 is deposited on a gate insulating film by low-pressure CVD. Herein, the thickness of the amorphous silicon layer 21 is, for example, 100 nm. Boron is doped. For example, the concentration of boron is 1E20 cm⁻².

Next, the amorphous silicon layer 21 is covered with a resist 30 in the area over the p-well 16 of the memory cell and in the area over the n-well 14 of the peripheral circuit. Phosphorus 1 is ion implanted into the amorphous silicon layer 21 in the area over the p-well 15 except the memory cell. For example, ion implantation of the phosphorus 1 is carried out at the energy of 10 keV and the dosage of 6E15 cm⁻².

As illustrated in FIG. 13B, the amorphous silicon layer 21 is covered with a resist 31 in the areas over the p-wells 15 and 16. Phosphorus 2 is ion implanted into the amorphous silicon layer 21 in the area above the n-well 14 of the peripheral circuit. For example, ion implantation of the phosphorus 2 is carried out at the energy of 10 keV and the dosage of 2E15 cm⁻².

The following steps (FIGS. 13C to 13E) are similar to those of the production process illustrated in FIGS. 10C to 10E and will not be described herein.

In a DRAM of a generation of the supply voltage of 1.8V or less or in a LSI with the DRAM, it is possible, according to the present invention, to improve the performance of the peripheral PMOS and to extend the refresh cycle. As a result, it is possible to reduce the power consumption of the DRAM.

While the present invention has thus far been disclosed in conjunction with several embodiments thereof, it will be readily possible for those skilled in the art to put the present invention into practice in various other manners.

What is claimed is:

1. A semiconductor device of a polysilicon gate electrode structure having three or more different Fermi levels, wherein:
   a P type polysilicon having a lowest Fermi level is disposed on a first N type surface channel MOS transistor,
   a first N type polysilicon having a highest Fermi level is disposed on a second N type surface channel MOS transistor, and
   a second N type polysilicon having an intermediate Fermi level between the highest and the lowest Fermi levels and doped with both an N type impurity and a P type impurity is disposed on a P channel MOS transistor.

2. A semiconductor device according to claim 1, wherein: the P channel MOS transistor and the second N type surface channel MOS transistor are disposed in a peripheral circuit while the first N type surface channel MOS transistor is disposed in a memory cell.

3. A semiconductor device according to claim 1, wherein: the second N type polysilicon containing both the P type impurity and the N type impurity has impurity concentration distribution in which the concentration of at least the N type impurity at an upper surface of the second N type polysilicon is higher than an average concentration in the second N type polysilicon.

4. A method of producing a semiconductor device according to claim 1, wherein: the second N type polysilicon containing both the P type impurity and the N type impurity is formed by doping at least the N type impurity by use of ion implantation.

5. A method of producing a semiconductor device according to claim 1, wherein: the P type polysilicon, the first N type polysilicon, and the second N type polysilicon are separately formed by use of two masks.

6. A semiconductor device including a DRAM having a gate electrode of a polymetal structure, according to claim 1.

7. A semiconductor device according to claim 1, wherein said P type polysilicon having the lowest Fermi level and disposed on the first N type surface channel MOS transistor is formed on a p-well for its substrate.

8. A semiconductor device according to claim 1, wherein the concentration of the p type impurity that is injected into the first N type surface channel is reduced such that a pn junction leak current is reduced.

9. A semiconductor device according to claim 1, wherein the P type polysilicon having the lowest Fermi level and disposed on the first N type surface channel MOS transistor has a lower boron content than the first N type polysilicon having the highest Fermi level and disposed on the second N type surface channel MOS transistor.

10. A method of producing a semiconductor device according to claim 1, wherein: the second N type polysilicon doped with both the N type impurity and the P type impurity is formed by simultaneously activating phosphorus and boron.

11. A method according to claim 10, wherein: diffusion of boron towards a substrate is suppressed by simultaneously activating phosphorus and boron.

12. A semiconductor device of a polysilicon gate electrode structure having three or more different Fermi levels, the semiconductor device comprising:
   a P type polysilicon having a lowest Fermi level, the P type polysilicon being disposed on a first N type surface channel MOS transistor,
   a first N type polysilicon having a highest Fermi level, the first N type polysilicon being disposed on a second N type surface channel MOS transistor, and
   a second N type polysilicon having an intermediate Fermi level between the highest and the lowest Fermi levels and doped with both an N type impurity and a P type impurity, the second N type polysilicon being disposed on a P channel MOS transistor, and being formed by simultaneously activating both the N-type and P-type dopants.

13. A semiconductor device according to claim 12, wherein the N-type and P-type dopants are phosphorus and boron and wherein diffusion of boron towards a substrate is suppressed by simultaneously activating the phosphorus and boron dopants.

14. A semiconductor device according to claim 12, wherein the P channel MOS transistor and the second N type surface channel MOS transistor are disposed in a peripheral circuit while the first N type surface channel MOS transistor is disposed in a memory cell.

15. A semiconductor device according to claim 12, wherein the second N type polysilicon containing both the P type impurity and the N type impurity has impurity concentration distribution in which the concentration of at least the N type impurity at an upper surface of the second N type polysilicon is higher than an average concentration in the second N type polysilicon.

16. A semiconductor device according to claim 12, wherein the second N type polysilicon containing both the P type impurity and the N type impurity is formed by doping at least the N type impurity by use of ion implantation.

17. A semiconductor device according to claim 12, wherein the P type polysilicon, the first N type polysilicon, and the second N type polysilicon are separately formed by use of two masks.

18. A semiconductor device according to claim 12, wherein said P type polysilicon having the lowest Fermi level and disposed on the first N type surface channel MOS transistor is formed on a p-well for its substrate.

19. A semiconductor device according to claim 12, wherein the concentration of the p type impurity that is injected into the first N type surface channel is reduced such that a pn junction leak current is reduced.

20. A semiconductor device according to claim 12, wherein the P type polysilicon having the lowest Fermi level and disposed on the first N type surface channel MOS transistor has a lower boron content than the first N type polysilicon having the highest Fermi level and disposed on the second N type surface channel MOS transistor.

* * * * *